(12) United States Patent
Kitano et al.

(10) Patent No.: US 8,808,011 B2
(45) Date of Patent: Aug. 19, 2014

(54) CONTACT AND BONDING STRUCTURE OF THE CONTACT

(75) Inventors: Hiroki Kitano, Nagoya (JP); Hideo Yumi, Nagoya (JP); Tatsuya Nakamura, Nagoya (JP)

(73) Assignee: Kitagawa Industries Co., Ltd., Aichi (JP)

( * ) Notice: Subject to any disclaimer, the term of this patent is extended or adjusted under 35 U.S.C. 154(b) by 0 days.

(21) Appl. No.: 13/520,246

(22) PCT Filed: Nov. 4, 2011

(86) PCT No.: PCT/JP2011/075475
§ 371 (c)(1),
(2), (4) Date: Jul. 2, 2012

(87) PCT Pub. No.: WO2012/063741
PCT Pub. Date: May 18, 2012

(65) Prior Publication Data
US 2013/0264098 A1    Oct. 10, 2013

(30) Foreign Application Priority Data

Nov. 9, 2010 (JP) ................................ 2010-250941
Sep. 28, 2011 (JP) ................................ 2011-212952

(51) Int. Cl.
| | |
|---|---|
| *H01R 12/00* | (2006.01) |
| *H01R 13/24* | (2006.01) |
| *H01R 12/57* | (2011.01) |
| *H01R 12/58* | (2011.01) |
| *H05K 3/34* | (2006.01) |
| *H05K 1/02* | (2006.01) |
| *H05K 1/18* | (2006.01) |

(52) U.S. Cl.
CPC .... *H05K 1/0213* (2013.01); *H05K 2201/09072* (2013.01); *H05K 1/182* (2013.01); *H01R 13/2421* (2013.01); *H01R 12/57* (2013.01); *H01R 12/58* (2013.01); *H05K 2201/1031* (2013.01); *H05K 3/341* (2013.01); *H01R 48/028* (2013.01); *Y10S 439/947* (2013.01)
USPC .............................. 439/83; 439/876; 439/947

(58) Field of Classification Search
CPC ....................................................... H01R 4/028
USPC ........................................... 439/83, 876, 947
See application file for complete search history.

(56) References Cited

U.S. PATENT DOCUMENTS

| | | | |
|---|---|---|---|
| 6,049,039 A | * | 4/2000 | Fushimi ...................... 174/68.1 |
| 6,699,080 B1 | | 3/2004 | Costa |

(Continued)

FOREIGN PATENT DOCUMENTS

| | | |
|---|---|---|
| CN | 1644000 A | 7/2005 |
| JP | 2002-009519 | 1/2002 |

(Continued)

OTHER PUBLICATIONS

Form PCT/ISA/210 from PCT application No. PCT/JP2011/075475, Nov. 29, 2011.

*Primary Examiner* — James Harvey
(74) *Attorney, Agent, or Firm* — Davis & Bujold, PLLC; Michael J. Bujold

(57) ABSTRACT

A contact capable of electrically connecting an electrically conductive portion provided on a plate-like member with an electrically conductive member different from the plate-like member. The contact includes a main body; a movable portion held by the main body so as to be reciprocal in directions of increasing and decreasing of a projecting amount thereof outwardly of the main body; and a biasing mechanism that biases the movable portion in such a direction that the projecting amount of the movable portion increases. The main body includes a tubular portion, a solder inflow suppressing portion, and a soldering portion.

7 Claims, 6 Drawing Sheets

(56) References Cited

U.S. PATENT DOCUMENTS

| | | | |
|---|---|---|---|
| 6,787,700 B2 * | 9/2004 | Nagao et al. | 174/541 |
| 6,790,056 B2 | 9/2004 | Buondelmonte et al. | |
| 7,632,112 B2 * | 12/2009 | Wakamatsu et al. | 439/83 |
| 7,695,285 B2 | 4/2010 | Sugiura et al. | |
| 7,976,319 B2 * | 7/2011 | Nguyen et al. | 439/83 |
| 2004/0140821 A1 | 7/2004 | Lee | |
| 2005/0064745 A1 * | 3/2005 | Zhang | 439/83 |
| 2013/0264098 A1 * | 10/2013 | Kitano et al. | 174/250 |

FOREIGN PATENT DOCUMENTS

| | | |
|---|---|---|
| JP | 2003-272797 | 9/2003 |
| JP | 2003-346952 | 12/2003 |
| JP | 2004-226397 | 8/2004 |
| JP | 2007-502520 | 2/2007 |
| JP | 2009-289731 | 12/2009 |
| WO | 2005/018058 A1 | 2/2005 |

\* cited by examiner

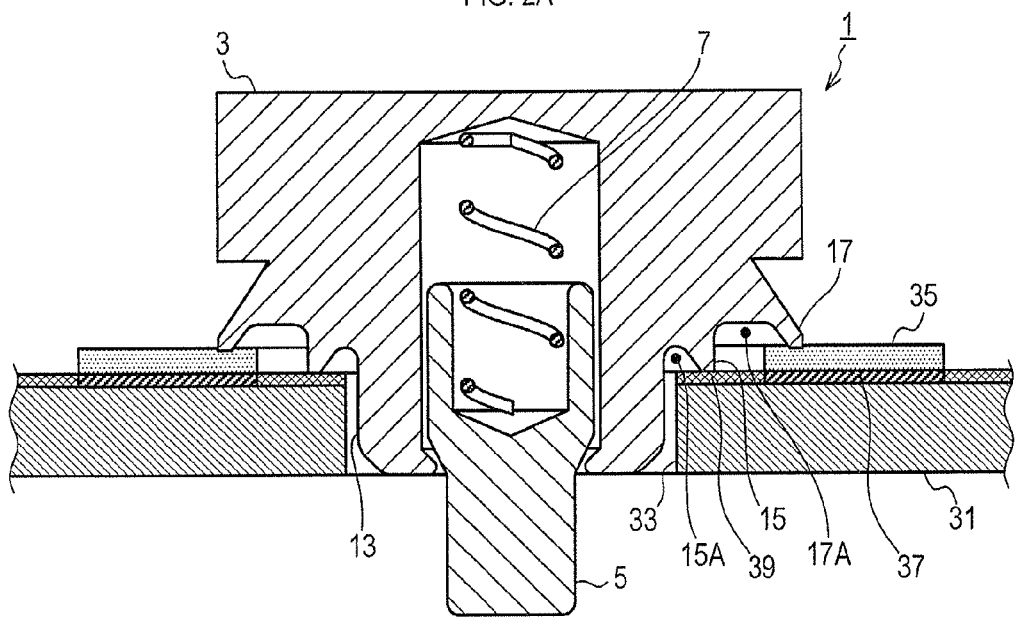
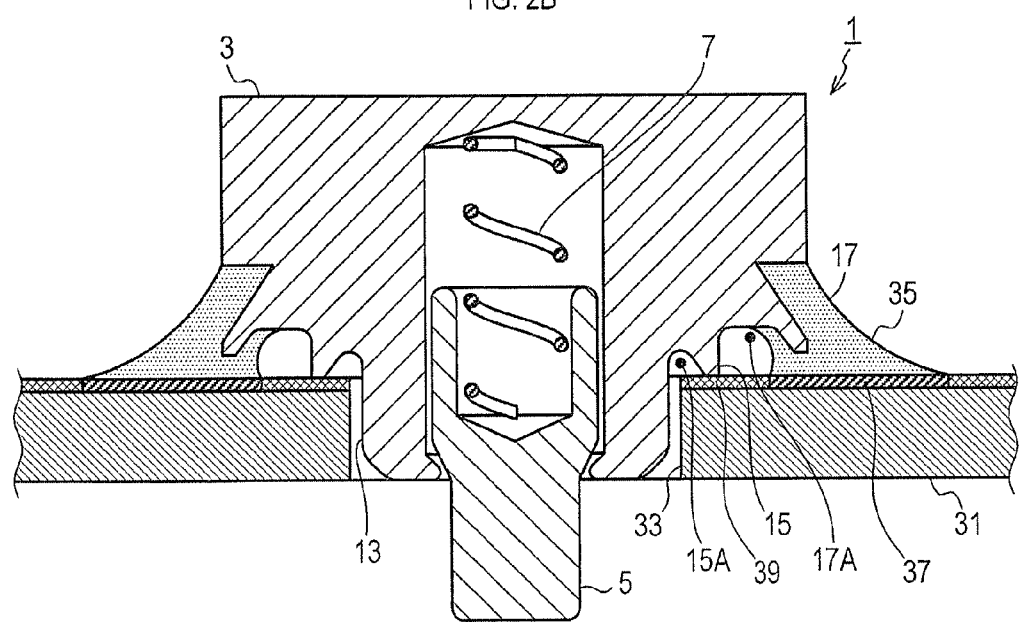

CONTACT AND BONDING STRUCTURE OF THE CONTACT

CROSS-REFERENCE TO RELATED APPLICATIONS

This international application is a national stage completion of PCT/JP2011/075475 filed Nov. 4, 2011 which claims priority from Japanese Patent Application No. 2010-250941 filed Nov. 9, 2010 in the Japan Patent Office, and Japanese Patent Application No. 2011-212952 filed Sep. 28, 2011 in the Japan Patent Office, the disclosures of which are incorporated herein by reference.

TECHNICAL FIELD

The present invention relates to a contact that is soldered to a plate-like member, such as a printed circuit board, and is made to contact another electrically conductive member, thereby being capable of electrically connecting the two members, and also relates to a bonding structure of the contact.

BACKGROUND ART

There is conventionally known a contact capable of electrically connecting two members, in which a main body is soldered to a printed circuit board, and a movable portion resiliently held by the main body so as to be forwardly and rearwardly movable in an axial direction is configured to contact another electrically conductive member (see, for example, Patent Document 1).

In a case of the contact described in Patent Document 1, it is possible to insert the main body into an attachment hole penetrating through the printed circuit board, and to solder the main body in such state to the printed circuit board, thereby allowing suppression of a projecting amount from the printed circuit board. Accordingly, the contact with such configuration may be employed for a device in which a distance between a printed circuit board and another electrically conductive member is relatively small.

Also, a stroke amount of the movable portion may be designed to be larger than the projecting amount from the printed circuit board, and bottoming of the movable portion may be easily suppressed. Thus, it is possible to make the movable portion contact another conductive member with an appropriate contact pressure.

PRIOR ART DOCUMENTS

Patent Document

Patent Document 1: Publication of Japanese Translation of PCT International Application Publication No. 2007-502520

SUMMARY OF THE INVENTION

Problems to be Solved by the Invention

In the case of the conventional contact described above, when performing soldering with the main body inserted into the attachment hole in the printed circuit board, molten solder sometimes flows into the attachment hole. When an inflow amount of the solder is large, the solder sometimes even reaches the movable portion.

That leads to a problem that, if the solder which has reached the movable portion is solidified, movement of the movable portion is inhibited, and thereby the movable portion cannot be made to contact another electrically conductive member with an appropriate contact pressure.

The present invention, which has been made to solve the above problem, has an objective to provide a contact which is capable of suppressing molten solder from flowing into the attachment hole formed in the plate-like member when performing soldering with the main body inserted into the attachment hole in the plate-like member, and to provide a bonding structure of such configured contact.

Means for Solving the Problems

Hereinafter, configurations employed in the present invention will be described.

A contact of a first aspect of the present invention is a contact which is capable of electrically connecting an electrically conductive portion provided on a plate-like member with an electrically conductive member different from the plate-like member. The contact includes: a main body that is to be soldered to the electrically conductive portion provided on the plate-like member, and is configured to have an opening; a movable portion, one end of which projects outwardly of the main body from the opening and the other of which is introduced inwardly of the main body from the opening, the movable portion being held by the main body so as to be reciprocable in directions of increasing and decreasing of a projecting amount thereof outwardly of the main body; and a biasing mechanism that biases the movable portion in such a direction that the projecting amount of the movable portion increases. The main body includes: a tubular portion that has the opening formed at an end thereof and is to be inserted into an attachment hole penetrating through the plate-like member when the main body is soldered; a solder inflow suppressing portion that is provided on an outer circumferential side of the tubular portion so as to abut the plate-like member around the attachment hole when the tubular portion is inserted into the attachment hole, the solder inflow suppressing portion being capable of suppressing solder melted on an outer circumferential side of an abutting area between the solder inflow suppressing portion and the plate-like member from flowing into an inner circumferential side of the abutting area when the main body is soldered; and a soldering portion that is provided on an outer circumferential side of the solder inflow suppressing portion and is to be soldered to the electrically conductive portion provided on the plate-like member.

According to the contact with such configuration, when the tubular portion is inserted into the attachment hole penetrating through the plate-like member in soldering the main body to the electrically conductive portion provided on the plate-like member, the solder inflow suppressing portion abuts the plate-like member around the attachment hole.

When, in this state, the soldering portion provided on the outer circumferential side of the solder inflow suppressing portion is soldered to the electrically conductive portion provided on the plate-like member, solder is melted on the outer circumferential side of the abutting area between the solder inflow suppressing portion and the plate-like member (hereinafter, the solder which is melted is referred to as "molten solder"). In this case, the solder inflow suppressing portion suppresses the molten solder from flowing into the inner circumferential side of the abutting area.

More specifically, the solder inflow suppressing portion serves as an obstacle for preventing, around the attachment hole, the molten solder from flowing into the attachment hole, and completely prevents the molten solder from flowing into the inner circumferential side of the solder inflow suppressing portion, or reduces an inflow amount into the inner circumferential side of the solder inflow suppressing portion to such an extent that no actual harm will be caused.

Accordingly, with the above-configured contact, a large amount of molten solder will not flow into the attachment hole on the inner circumferential side of the solder inflow suppressing portion, or such molten solder will not reach the movable portion. It is, therefore, possible to avoid in advance inhibition of movement of the movable portion due to soldering.

In a contact of a second aspect of the present invention, it is preferable that the soldering portion of the contact in the first aspect is configured to include a region which forms a gap between the soldering portion and the plate-like member when the solder inflow suppressing portion comes into abutment with the plate-like member around the attachment hole.

According to the contact configured as above, when the molten solder enters into the gap formed between the soldering portion and the plate-like member, and both regions which form the gap are wetted by the molten solder, a surface tension of the molten solder acts in a direction of attracting the both regions which form the gap to each other.

As a result, the solder inflow suppressing portion is slightly biased toward the plate-like member. Accordingly, a contact pressure between the solder inflow suppressing portion and the plate-like member is improved, as compared with a case without the region which forms the gap. According to the contact configured as above, therefore, it is possible to further improve an effect of suppressing the molten solder from flowing into the inner circumferential side of the solder inflow suppressing portion.

In a contact of a third aspect of the present invention, it is preferable that the soldering portion in the first aspect or the second aspect includes surfaces to be wetted up by molten solder when the main body is soldered, the surfaces being sloped surfaces which are sloped with respect to a front surface or a reverse surface of the plate-like member.

According to the contact configured as above, when the main body is soldered, molten solder wets up the sloped surfaces. As a result, an amount of the molten solder to wet up may be increased, as compared with a case of the molten solder wetting up a vertical surface with respect to the front surface or the reverse surface of the plate-like member against the gravity.

With the contact configured as above, therefore, an amount of the molten solder which is likely to flow into inside of the solder inflow suppressing portion may be reduced by an increase in amount of the molten solder wetting up the soldering portion. Accordingly, this configuration may also further improve the effect of suppressing the molten solder from flowing into the inner circumferential side of the solder inflow suppressing portion.

In a contact of a fourth aspect of the present it is preferable that the soldering portion in the contact of the third aspect is configured to have a conical cylindrical portion such that the closer to the plate-like member when the main body is soldered, the larger a diameter thereof becomes, so that an inner periphery and an outer periphery of the conical cylindrical portion form the sloped surfaces.

According to the contact configured as above, since the inner periphery and the outer periphery of the conical cylindrical portion function as the above-mentioned sloped surfaces, the molten solder wets up the inner periphery and the outer periphery of the conical cylindrical portion. Then, an amount of the molten solder which is likely to flow into inside of the solder inflow suppressing portion may be reduced accordingly.

In a contact of a fifth aspect of the present invention, it is preferable that the main body in the contact of any one of the first to fourth aspects includes a suction surface, which is suctionable by a suction nozzle of an automatic mounting machine, formed at a position opposite to where the tubular portion is provided, and a protrusion is provided on the suction surface such that the protrusion enters into an opening at a tip of the suction nozzle when the suction surface is suctioned by the suction nozzle.

According to the contact configured as above, it is possible to mount the contact on the printed circuit board using an automatic mounting machine. In this case, since the protrusion formed on the suction surface enters into the opening at the tip of the suction nozzle, optimization of a suction position by the suction nozzle may be easily achieved.

It is a fact experimentally confirmed by the inventors of the present invention that the suction position is optimized by providing the protrusion, and the reason why the suction position is optimized is not figured out clearly. However, there may be the following assumable reasons. For example, in the case where the protrusion is provided, even if suction is performed at a position where the opening at the tip of the suction nozzle and the protrusion are slightly deviated from each other, a suction force to attract the protrusion into the opening at the tip of the suction nozzle is more likely to act on the protrusion. When the protrusion is attracted by the suction force into the opening at the tip of the suction nozzle, the contact may be guided to a more appropriate position. Alternatively, the suction force is likely to be larger in a central area of the opening than in a peripheral of the opening, having a larger flow resistance, in a vicinity of the opening of the suction nozzle, and therefore the protrusion, if provided at a deviated position of the opening, may be more likely to be attracted to the central area of the opening. In any event, there is a tendency that variability in suction position is suppressed by providing the protrusion, as compared with a case of providing no protrusion.

In addition to suppressing variability in suction position as described above, there is an advantage even if the protrusion abuts a periphery of the tip of the suction nozzle due to a large deviation of the suction position. Specifically, even if the protrusion abuts the periphery of the tip of the suction nozzle, and thereby the protrusion is not attracted into the opening at the tip of the suction nozzle, an improper suction can be detected by the automatic mounting machine since a gap is formed between the suction nozzle and the suction surface. That is, suction cannot be completed with a large deviation in suction position, and it is possible to make the automatic mounting machine detect an error when there is a large deviation in suction position.

Accordingly, as compared with a case without the above-configured protrusion, a slight deviation in suction position can be corrected and also a large deviation in suction position can be detected as an error. Therefore, optimization of the suction position and quality control may be facilitated, and positioning of the solder inflow suppressing portion and the soldering portion may be performed more appropriately.

Further, in a case where the protrusion enters into the opening at the tip of the suction nozzle, even if the contact slightly slides with respect to the suction nozzle while the suction nozzle is moved to convey the contact, further sliding is suppressed once the protrusion gets caught by an inner circumference of the suction nozzle. Accordingly, deviation caused while conveying the contact can be suppressed by the protrusion, which also serves for appropriate positioning of the solder inflow suppressing portion and the soldering portion.

In a contact of a sixth aspect of the present invention, it is preferable that the main body in the contact of any one of the first aspect to the fifth aspect includes a suction surface, which is suctionable by a suction nozzle of an automatic mounting machine, formed at a position opposite to where the tubular portion is provided, and the main body includes a through hole penetrating through between the suction surface and a housing space for the movable portion toward the housing space.

According to the contact configured as above, since the movable portion is suctioned via the through hole when mounting the contact on the printed circuit board using the automatic mounting machine, the movable portion is attracted inward the main body by the suction force. Accordingly, during the suction by the suction nozzle, a projecting amount of the movable portion is smaller. Therefore, as compared with a case of a larger projecting amount, it is easier to put out the contact from a recess in a carrier tape or a tray containing the contact, which may contribute to an improvement in mounting speed.

A contact bonding structure according to a seventh aspect of the present invention is a contact bonding structure constituted by soldering the contact of any one of the first aspect to the sixth aspect to an electrically conductive portion provided on a plate-like member. It is preferable that the plate-like member includes: an attachment hole formed to penetrate through the plate-like member, and the electrically conductive portion formed on an outer circumferential side of the attachment hole and spaced a distance apart from the attachment hole; and the solder inflow suppressing portion is configured to abut the plate-like member in an area defining the distance between the attachment hole and the electrically conductive portion when the tubular portion is inserted into the attachment hole.

According to the contact bonding structure as configured above, since the contact of any one of the first aspect to the sixth aspect is included, a large amount of molten solder will not flow into the attachment hole on the inner circumferential side of the solder inflow suppressing portion to reach the movable portion, due to the already described reason. It is, therefore, possible to avoid in advance inhibition of movement of the movable portion due to soldering.

BRIEF DESCRIPTION OF THE DRAWINGS

FIG. 1A is a plan view of the contact, FIG. 1B is a bottom view of the contact, FIG. 1C is a front elevational view of the contact, FIG. 1D is a right side elevational view of the contact, FIG. 1E is a cross-sectional view of the contact along a line IE-IE, and FIG. 1F is a perspective view showing a front side, a right side, and a bottom side of the contact.

FIGS. 2A-2B are views showing the contact exemplified as the first embodiment. FIG. 2A is a cross-sectional view showing the contact before soldering disposed on a print circuit board, and FIG. 2B is a cross-sectional view showing the contact soldered on the print circuit board.

FIG. 3A is a plan view of the contact, FIG. 3B is a front elevational view of the contact, and FIG. 3C is a cross-sectional view of the contact along a line IIIC-IIIC.

FIG. 4A is a cross-sectional view showing a state of being contained at a biased position in an embossed pocket, FIG. 4B is a cross-sectional view showing a state where a bias has been corrected as a result of suction by a suction nozzle, and FIG. 4C is a cross-sectional view showing a state where correction of a bias has failed although suction by a suction nozzle is performed.

FIG. 5A is a plan view of the contact, FIG. 5B is a front elevational view of the contact, and FIG. 5C is a cross-sectional view of the contact along a line VC-VC.

EXPLANATION OF REFERENCE NUMERALS

Figure 1A:
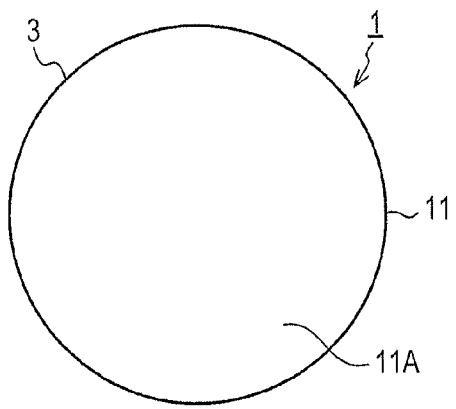
FIGS. 1A-1F are views showing a contact exemplified as a first embodiment.
Figure 1B:
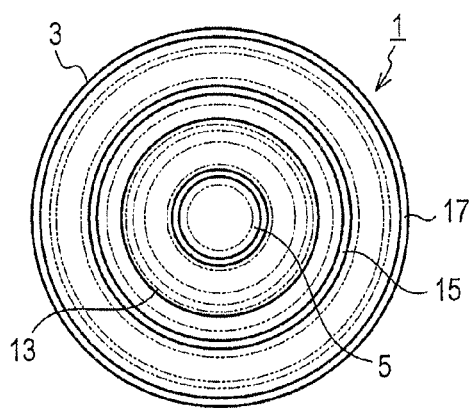
Figure 1C:
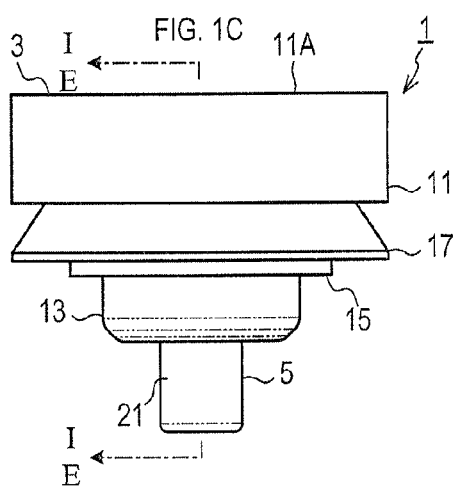
Figure 1D:
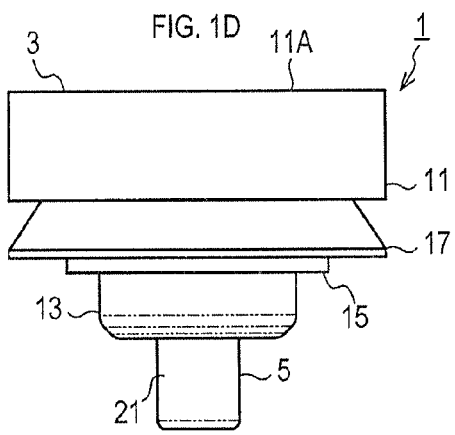
Figure 1E:
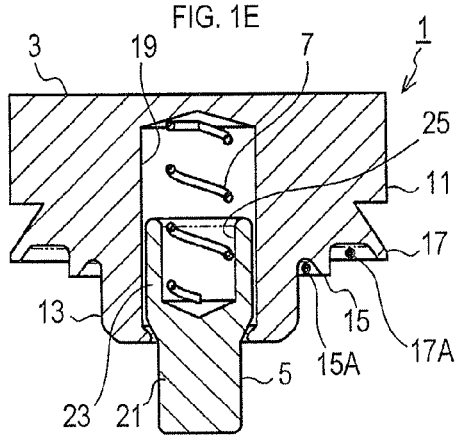
Figure 1F:
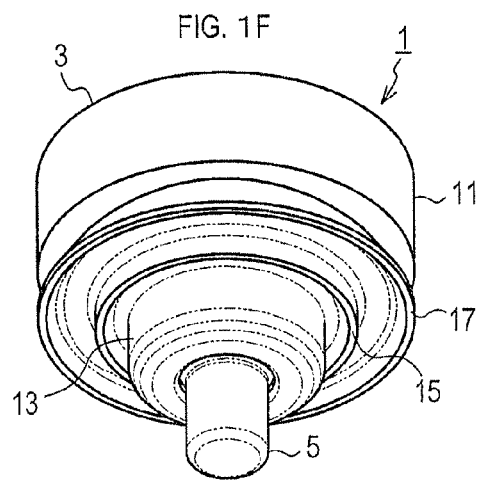

1 . . . contact, 3 . . . main body, 5 . . . movable portion, 11 . . . base, 13 . . . tubular portion, 15 . . . solder inflow suppressing portion, 15A, 17A . . . recess, 17 . . . soldering portion, 19, 25 . . . hole, 21 . . . smaller diameter portion, 23 . . . larger diameter portion, 31 . . . printed circuit board, 33 . . . attachment hole, 37 . . . electrically conductive portion, 39 . . . solder registration portion

MODE FOR CARRYING OUT THE INVENTION

Embodiments of the present invention will next be described by way of examples.

[1] First Embodiment

As shown in FIG. 1A to FIG. 1F, a contact 1 includes a main body 3 of metal and a movable portion 5 of metal which is held by the main body 3 in a reciprocable manner, and a compression spring 7 which biases the movable portion 5 in one direction (corresponding to an example of a biasing mechanism in the present invention). In the description hereinafter, a biasing direction by the compression spring 7 against the movable portion 5 is referred to as "down" and a direction opposite to "down" is referred to as "up". However, these up and down directions are defined merely for convenience in order to concisely describe relative positional relationships among various portions included by the contact 1, and do not mean that a mounting direction of the contact 1 should be a specified direction.

The main body 3 includes a base 11 formed to have a substantially cylindrical shape, a tubular portion 13, which is a portion projecting downward from a position lower than the base 11 and having a substantially cylindrical shape with a smaller diameter than the base 11, a solder inflow suppressing portion 15, which is a portion projecting downward from a position lower than the base 11 and having an annular shape surrounding the tubular portion 13, and a soldering portion 17, which is a portion projecting obliquely downward from the base 11 and the portion having a conical cylindrical portion surrounding the solder inflow suppressing portion 15. Also, in the present embodiment, the contact 1 is configured as an automatic mounting part capable of being mounted by an automatic mounting machine. The main body 3 includes a suction surface 11A capable of being suctioned by a suction nozzle of the automatic mounting machine on an upper surface of the base 11 (i.e., at a position opposite to where the tubular portion 13 is provided on the main body 3).

A lower end of the tubular portion 13 is positioned lower than a lower end of the solder inflow suppressing portion 15 and upper than a lower end of the soldering portion 17. Also, an annular recess 15A, which is upwardly concave, is formed on an inner circumferential side of the solder inflow suppressing portion 15, while an annular recess 17A, which is upwardly concave, is formed on an inner circumferential side of the soldering portion 17.

The main body 3 also includes a hole 19 formed upwardly from the lower end of the tubular portion 13. One end of the movable portion 5 projects outwardly from an opening located at a lower end of the hole 19, while the other end of the movable portion 5 is housed inside the hole 19.

The one end of the movable portion 5 constitutes a smaller diameter portion 21 having a diameter smaller than the opening of the hole 19, while the other end of the movable portion 5 constitutes a larger diameter portion 23 having a diameter larger than the opening of the hole 19. Accordingly, the larger diameter portion 23 cannot pass through the opening of the hole 19, and thus the movable portion 5 is reciprocable upwardly and downwardly within a range where the larger diameter portion 23 can move inside the hole 19.

Also, the movable portion 5 includes a hole 25 formed downwardly from an upper end thereof, and a lower end of the compression spring 7 is introduced inside the hole 25. An upper end of the compression spring 7 abuts an upper end ceiling of the hole 19, and the compression spring 7 is compressed between the upper end ceiling of the hole 19 and a lower end bottom surface of the hole 25. Due to a resilient restoring force caused by the compression, the movable portion 5 is biased downwardly.

The contact 1 configured as above is placed on a printed circuit board 31, as shown in FIG. 2A, prior to soldering thereof on the printed circuit board 31. In placing the contact 1, the tubular portion 13 is inserted into an attachment hole 33 penetrating through the printed circuit board 31.

At that time, the lower end of the solder inflow suppressing portion 15 abuts an upper surface of the printed circuit board 31. Since the lower end of the solder inflow suppressing portion 15 is designed to be positioned above the lower end of the tubular portion 13 by a thickness of the printed circuit board 31, a lower end surface of the tubular portion 13 becomes level with a lower surface of the printed circuit board 31.

Also, solder 35 in paste form is applied onto the printed circuit board 31, and the lower end of the soldering portion 17 is slightly buried in the solder 35 in paste form when the contact 1 is placed on the printed circuit board 31.

In this state, the lower end of the soldering portion 17 does not abut the upper surface of the printed circuit board 31, and the solder 35 is present in a gap formed between the lower end of the soldering portion 17 and the printed circuit board 31. As described above, the soldering portion 17 is dimensioned such that the lower end thereof is to be slightly buried in the solder 35 in paste form, so that the soldering portion 17 does not press the solder 35 in past form excessively, and thereby the solder 35 in paste form is prevented from being moved to the inner circumferential side of the soldering portion 17.

The solder 35 in past form is applied to an area corresponding to an electrically conductive portion 37 (land pattern) on the printed circuit board 31. The electrically conductive portion 37 is formed at a position spaced a slight distance apart from the attachment hole 33. A solder registration portion 39 is formed between the electrically conductive portion 37 and the attachment hole 33.

The lower end of the solder inflow suppressing portion 15 abuts the printed circuit board 31 within the solder registration portion 39 located between the electrically conductive portion 37 and the attachment hole 33. The electrically conductive portion 37 is positioned considering the position of the lower end of the solder inflow suppressing portion 15 so that abutment at such position can be made.

The contact 1 placed on the printed circuit board 31 in the above-described manner is heated together with the printed circuit board 31 in a reflow furnace, and thereby the solder 35 becomes melted. Once the solder 35 becomes melted, the molten solder 35 wets up the soldering portion 17 on the outer circumferential side and the inner circumferential side thereof. Wetting up of the molten solder here means a state in which the solder rises so as to be bonded to the soldering portion due to wetting properties of the solder.

Since the molten solder 35 wets up on the outer circumferential side of the soldering portion 17, an amount of the solder which enters into the inner circumferential side of the soldering portion 17 becomes smaller than an amount of the solder 35 applied to the printed circuit board 31 by an amount of wetting. In a case where the amount of the solder 35 applied to the printed circuit board 31 is a standard amount, a small void remains in the recess 17A, as shown in FIG. 2B.

Accordingly, even if the amount of the solder 35 is larger than the standard amount to some extent (for example, the solder 35 is applied with a larger thickness than a standard thickness), the contact 1 still has a space of the void, and the molten solder 35 basically will not approach the solder inflow suppressing portion 15.

Also, even if the amount of the solder 35 is further larger for some reason, thereby causing the solder 35 to reach the solder inflow suppressing portion 15, the solder 35 in such case can be prevented, by the solder inflow suppressing portion 15, from flowing further into the inner circumferential side thereof.

Specifically, since the lower end of the solder inflow suppressing portion 15 abuts the solder registration portion 39 between the electrically conductive portion 37 and the attachment hole 33, the solder 35 is less likely to flow into this abutting area. In addition, a surface tension of the solder 35 which wets up the soldering portion 17 on the outer circumferential side and the inner circumferential side acts as a force to attract the soldering portion 17 toward the printed circuit board 31, and the lower end of the solder inflow suppressing portion 15 is also biased toward the printed circuit board 31. Accordingly, due to such action, inflow of the solder 35 into the inner circumferential side can be completely prevented at the lower end of the solder inflow suppressing portion 15.

Another exceptional case may be that the amount of the solder 35 applied to the printed circuit board 31 is far larger than an expected standard amount. In this case, even if a tiny amount of the solder 35 enters into the inner circumferential side of the solder inflow suppressing portion 15 due to a far larger amount of the solder 35 than the expected standard amount, further entrance of the solder 35 can be surely prevented since an auxiliary recess 15A is provided in the inner circumferential side of the solder inflow suppressing portion 15. Accordingly, the solder 35 will not flow into the attachment hole 33.

Therefore, as a result of the above, inflow of the solder 35 into the attachment hole 33 may be extremely highly suppressed. Consequently, with a solder bonding structure using the contact 1 configured as above, it is unlikely that a large amount of molten solder flows into the attachment hole 33 to reach the movable portion 5, and it is possible to suppress in advance the movable portion 5 from being inhibited due to soldering.

According to the contact 1 as described above, it is possible to insert the main body 3 (the tubular portion 13) into the attachment hole 33, and solder the main body 3, in such state, to the printed circuit board 31. It is, therefore, possible to suppress a projecting amount from the lower surface of the printed circuit board 31. Thus, the contact 1 with such configuration may be employed for a device in which a distance between the lower surface of the printed circuit board 31 and another conductive member is relatively small.

Further, a stroke amount of the movable portion 5 may be designed to be larger than the projecting amount thereof from the lower surface of the printed circuit board 31, and bottoming of the movable portion 5 may be easily suppressed. Thus, it is possible to make the movable portion 5 contact another conductive member with an appropriate contact pressure.

[2] Second Embodiment

A second embodiment will next be described. However, the second and subsequent embodiments have mostly the same configurations as that of the first embodiment, although including partial differences in configuration from the first embodiment. In the description hereinafter, therefore, the differences will be mainly explained in detail, while the elements which are the same as in the first embodiment will be assigned the same reference numerals, and redundant explanation of the first embodiment will be avoided.

Figure 3A:
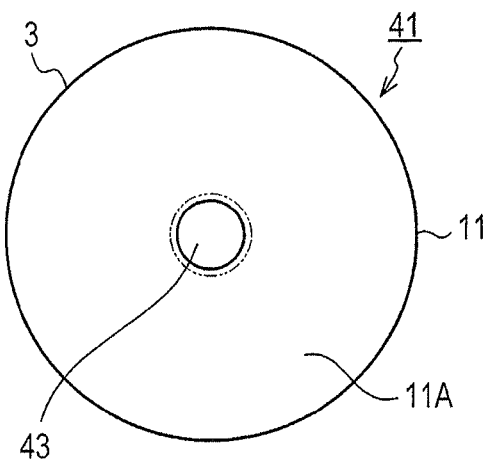
FIGS. 3A-3C are views showing a contact exemplified as a second embodiment.
Figure 3B:
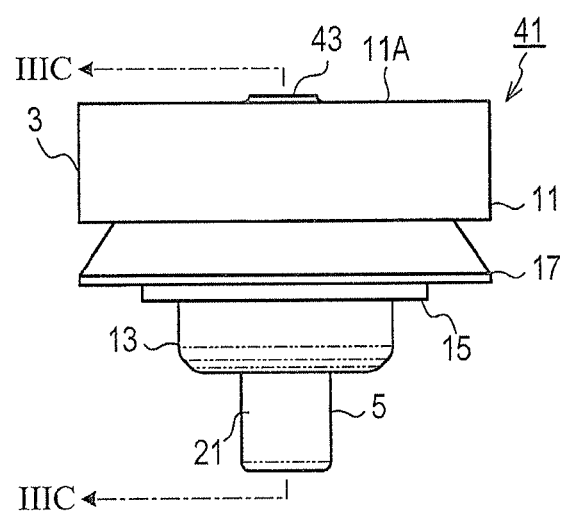
Figure 3C:
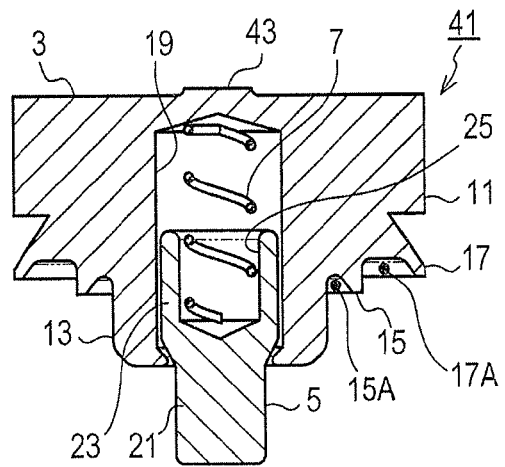

As shown in FIG. 3A-FIG. 3C, a contact 41 has substantially the same configuration as the contact 1 exemplified in the first embodiment, but is different from the first embodiment in that a protrusion 43 is provided on the suction surface 11A.

Figure 4A:
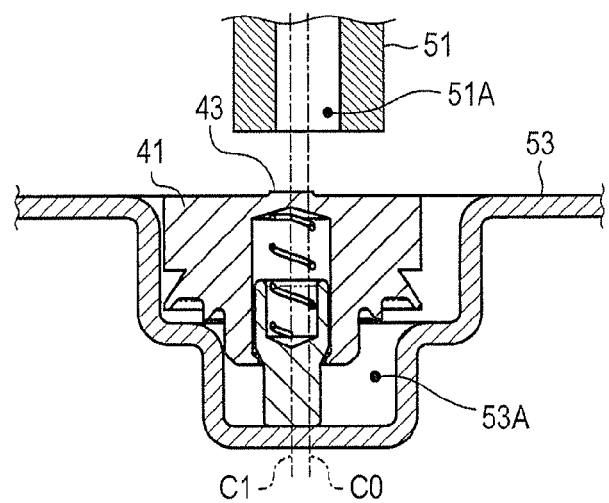
FIGS. 4A-4C are views showing the contact exemplified as the second embodiment.
Figure 4B:
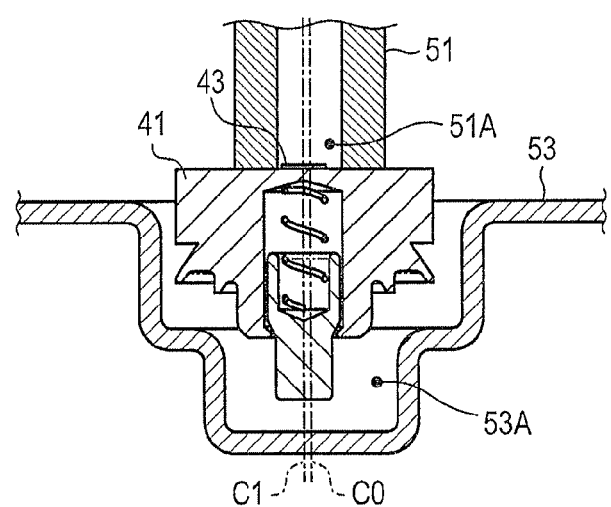

According to the contact 41 configured as above, the same operation and effects as in the first embodiment may be achieved. Also, when surface mounting the contact 41 on a printed circuit board using an automatic mounting machine, even if the contact 41 is contained in an emboss pocket 53A of a carrier tape 53 with a center C1 of the contact 41 slightly deviated from a center C0 of the suction nozzle 51, as shown in FIG. 4A, the protrusion 43 is suctioned into an opening 51A at a tip of the suction nozzle 51 when the contact 41 is suctioned by the suction nozzle 51. As a result, as shown in FIG. 4B, the deviation between the center C1 of the contact 41 and the center C0 of the suction nozzle 51 may be reduced.

Figure 4C:
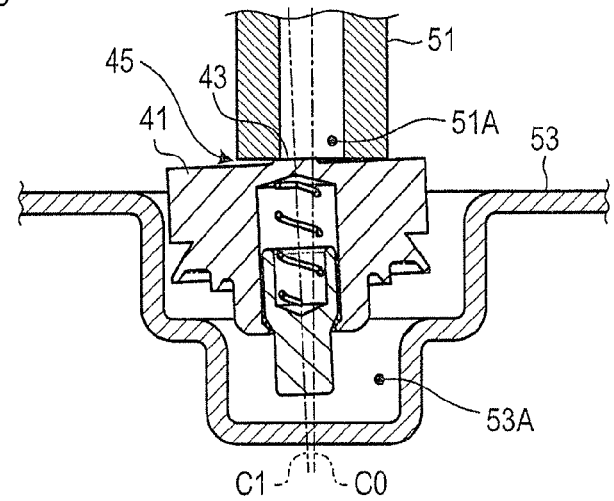

It is not clear why the deviation between the center C1 of the contact 41 and the center C0 of the suction nozzle 51 is reduced and a suctioning position is optimized as described above. However, the reason may be assumed, for example, as follows: when the protrusion 43 is provided, it may be more likely that a suction force to suction the protrusion 43 into the opening 51A at the tip of the suction nozzle 51 acts on the protrusion. For example, as shown in FIG. 4C, in a case where the protrusion 43 gets caught by the tip (lower end) of the suction nozzle 51 due to the deviation between the center C1 of the contact 41 and the center C0 of the suction nozzle 51, a gap 45 is generated at an area where the protrusion 43 is caught, and air is suctioned into the suction nozzle 51 from the gap 45. Due to an air flow generated by such suction of air, the protrusion 43 may be more likely to be suctioned into the opening 51A at the tip of the suction nozzle 51. Perhaps, such an action by the air flow may be already caused immediately before the protrusion 43 gets caught by the tip (lower end) of the suction nozzle 51. Such suction force may suction the protrusion 43 into the opening 51A at the tip of the suction nozzle 51, thereby guiding the contact 41 to a more appropriate position.

Alternatively, it may be assumed that, in a vicinity of the opening 51A of the suction nozzle 51, a suction force tends to be stronger in a central area of the opening than in a peripheral area of the opening, in which flow resistance is larger, and that when the protrusion 43 is positioned eccentrically with respect to a center of the opening 51A, the protrusion 43 is more likely to be attracted to the central area of the opening. In any event, a deviation in suction position tends to be suppressed by providing the protrusion 43, as compared with a case without the protrusion 43.

In addition to allowing suppression of the deviation in suction position as described above, even if the protrusion 43 is stuck abutting a periphery of the tip of the suction nozzle 51 with the suction position greatly deviated as shown in FIG. 4C, some advantage may be obtained. Specifically, even if the protrusion 43 abuts the periphery of the tip of the suction nozzle 51 and, as a result, the protrusion 43 is not attracted into the opening 51A at the tip of the suction nozzle 51, the gap 45 remains between the suction nozzle 51 and the suction surface 11A, and therefore an insufficient suction can be detected by the automatic mounting machine. That is, the contact 41 cannot be suctioned with a large deviation in suction position, and an error can be detected by the automatic mounting machine if there is a large deviation in suction position.

Accordingly, as compared with the case without the protrusion 43, a small deviation in suction position can be corrected and also a large deviation in suction position can be detected as an error. Thus, optimization of the suction position and quality control may be easily achieved, and positioning of the solder inflow suppressing portion 15 and the soldering portion 17 may be more appropriately performed.

Further, in a case where the above-configured protrusion 43 enters into the opening 51A at the tip of the suction nozzle 51, even if the contact 41 slightly slides with respect to the suction nozzle 51 while the suction nozzle 51 is moved to convey the contact 41, further sliding is suppressed once the protrusion 43 gets caught by an inner circumstance of the suction nozzle 51. Accordingly, deviation caused while the contact 41 is conveyed can be suppressed by the protrusion 43, which also serves for allowing appropriate positioning of the solder inflow suppressing portion 15 and the soldering portion 17.

Although it is preferable to employ the configuration exemplified in the second embodiment in order to optimize the suction position as described above, it is needless to say that whether or not to provide the protrusion 43 is optional, and the configuration in the first embodiment may be employed if there is any reason for avoiding providing the protrusion 43.

[3] Third Embodiment

A third embodiment will be described hereinafter.

Figure 5A:
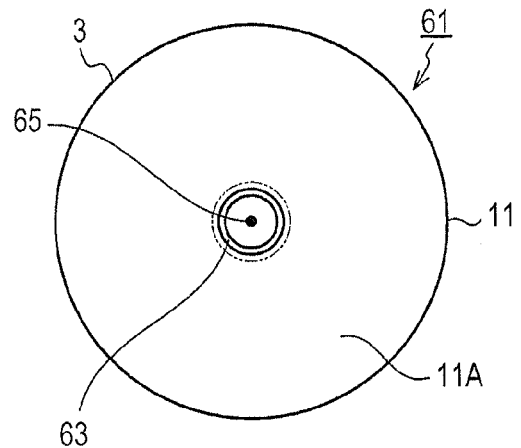
FIGS. 5A-5C are views showing a contact exemplified as a third embodiment.
Figure 5B:
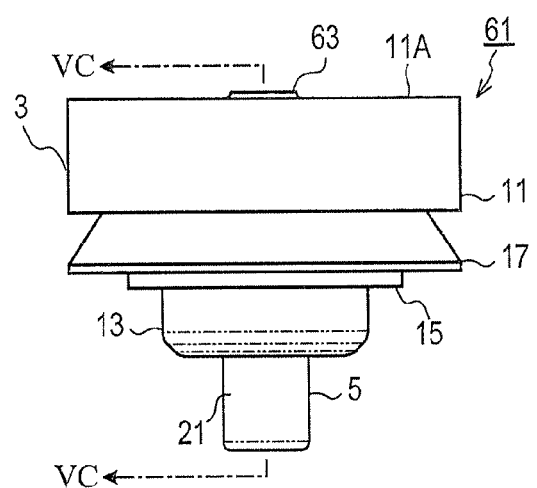
Figure 5C:
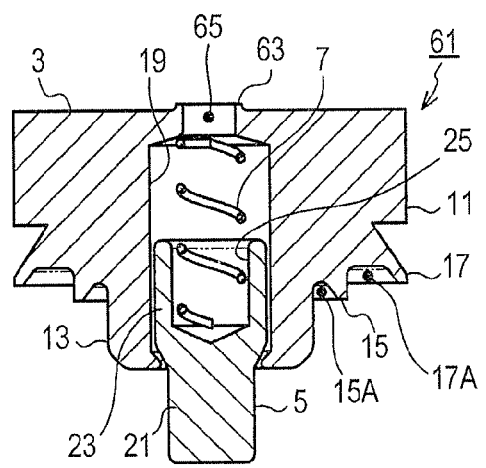

As shown in FIG. 5A to FIG. 5C, a contact 61 has substantially the same configuration as the contact 1 exemplified in the second embodiment, and it is similar to the second embodiment that a protrusion 63 is provided on the suction surface 11A. However, there is a difference from the second embodiment in that a through hole 65 is provided so as to penetrate through between a side of the suction surface 11A (an end (an upper end) of the protrusion 63 in the present embodiment) and a housing space for the movable portion 5.

According to the contact 61 configured as above, the same operation and effect as in the first embodiment may be achieved, and also the same operation and effect as in the second embodiment, i.e., the effect that optimization of the suction position is easier, may be achieved since the protrusion 63 is provided.

Figure 6A:
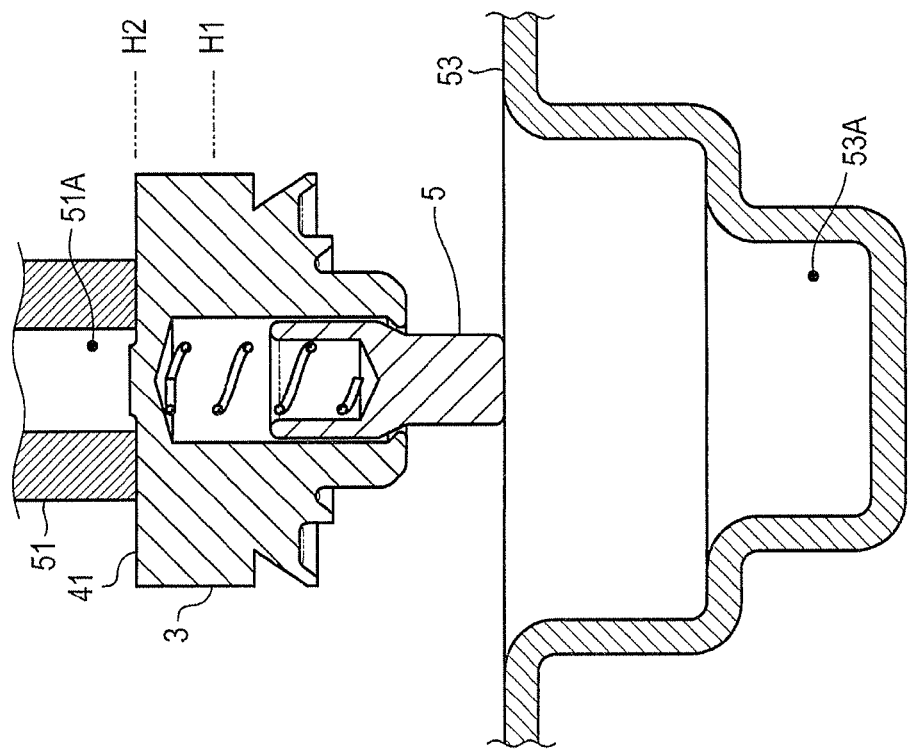
FIG. 6A is a view showing the contact exemplified as the third embodiment, which is a cross-sectional view showing a state where the movable portion is raised as a result of suction thereof by the suction nozzle.

Also, according to the contact 61, since the movable portion 5 is suctioned via the through hole 65 when mounting the contact 61 on the printed circuit board using the automatic mounting machine, the movable portion 5 is attracted inward the main body 3 by a suction force of the suction nozzle 51, as shown in FIG. 6A.

As a result, during the suction by the suction nozzle 51, a projecting amount of the movable portion 5 is smaller. Therefore, the suction nozzle 51 can start moving horizontally once the contact 61 has been raised by the suction nozzle 51 to a height position H1 shown in FIG. 6A. Accordingly, it is easier to put out the contact 61 from the embossed pocket 53A of the carrier tape 53 in which the contact 61 is contained, which contributes to an improvement in mounting speed.

Figure 6B:
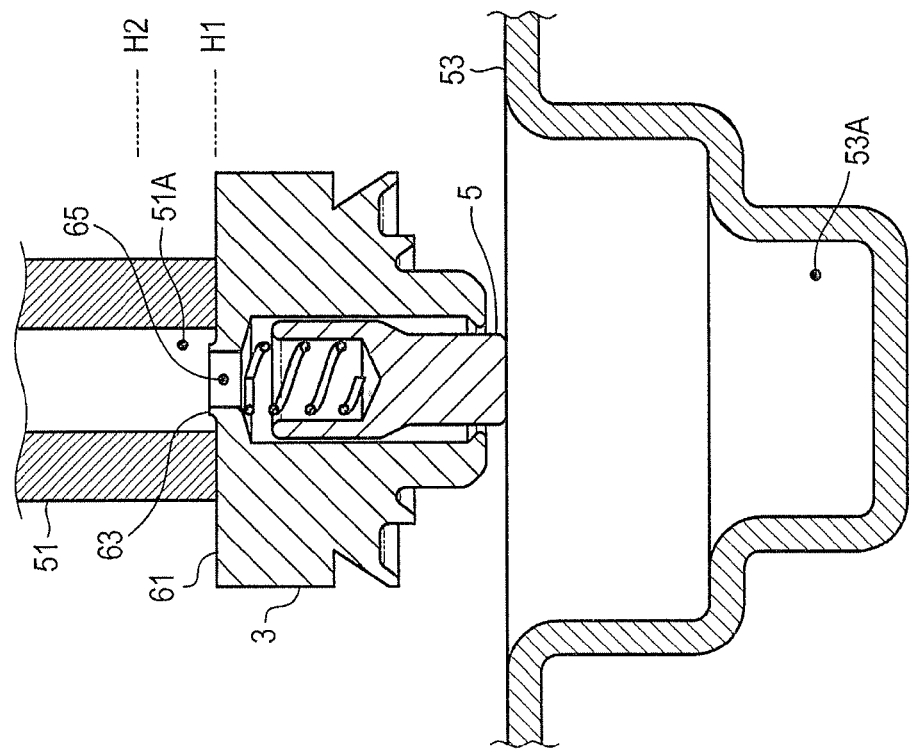
FIG. 6B is a view showing the contact exemplified as the second embodiment, which is a cross-sectional view showing an example where the movable portion is not raised as a result of suction thereof by the suction nozzle.

For comparison, in the contact 41 exemplified in the second embodiment, for example, since a configuration equivalent to the through hole 65 is not provided, the movable portion 5 does not move even during suction by the suction nozzle 51 and the projecting amount of the movable portion 5 is larger than in the case of the contact 61 as shown in FIG. 6B. Accordingly, the suction nozzle 51 cannot start moving horizontally until the contact 61 has been raised by the suction nozzle 51 to a height H2 (positioned higher than the height H1) shown in FIG. 6B, which leads to reduction in the mounting speed.

Consequently, it may be preferable to employ the configuration exemplified in the third embodiment in order to improve the mounting speed. However, it is needless to say that whether or not to provide the through hole 65 is optional, and that the configuration in the first embodiment or the second embodiment may be employed if there is any reason for avoiding providing the through hole 65.

In the case where the above-configured through hole 65 is provided, when heating is performed in a reflow furnace in order to solder the contact 61 to the printed circuit board, hot air in the furnace easily enters inside the contact 61 via the through hole 65. As a result, there is an effect that since a closed space which serves as a heat-insulating layer is not formed in the contact 61, the contact 61 is facilitated to be heated evenly, and thus good soldering may be achieved.

Further, with the through hole 65 provided, a plating solution or a cleaning agent can easily enter into the housing area for the movable portion 5 when plating the housing area for the movable portion 5 or cleaning the housing area for the movable portion 5. In this respect, therefore, it is preferable to provide the through hole 65.

[4] Other Embodiments

Although the embodiments of the present invention have been described above, the present invention should not be limited to the specified embodiments, but may be practiced in other various forms.

For example, while the soldering portion 17 exemplified in the above-described embodiments has a conical cylindrical portion which appears to be substantially a cone frustum when seen from a front thereof (see FIG. 1C), whether or not to employ such configuration is optional.

It is to be noted, however, that when a surface to be wetted up by the solder 35 is a sloped surface like an outer circumferential surface or an inner circumferential surface of the above-mentioned conical cylindrical portion, an action of gravity pulling the solder 35 downward is weaker as compared with a case of a vertical surface and thus wetting up of the solder 35 is accelerated. Therefore, in a case where an amount of the solder 35 is relatively large, an effect to reduce the solder, which is to flow into the lower end of the solder inflow suppressing portion 15, may be accelerated.

Also, while the through hole 65 penetrating through between the end (the upper end) of the protrusion 53 and the housing space for the movable portion 5 is exemplified in the third embodiment, whether or not to provide the protrusion 53 on the suction surface 11A is optional. Even in a case where the protrusion 53 is not provided, a through hole penetrating through between the suction surface 11A and the housing space for the movable portion 5 may be provided.

The invention claimed is:

1. A contact which is capable of electrically connecting an electrically conductive portion provided on a plate-like member with an electrically conductive member different from the plate-like member, the contact comprising:
   a main body that is to be soldered to the electrically conductive portion provided on the plate-like member, and being configured to have an opening;
   a movable portion, one end of which projects outwardly of the main body from the opening and the other of which is introduced inwardly of the main body from the opening, the movable portion being held by the main body so as to be reciprocable in directions of increasing and decreasing of a projecting amount thereof outwardly of the main body; and
   a biasing mechanism that for biasing the movable portion in such a direction that the projecting amount of the movable portion increases,
   the main body including:
      a tubular portion that has the opening formed at an end thereof and is to be inserted into an attachment hole penetrating through the plate-like member when the main body is soldered;
      a solder inflow suppressing portion that is provided on an outer circumferential side of the tubular portion so as to abut the plate-like member around the attachment hole when the tubular portion is inserted into the attachment hole, the solder inflow suppressing portion being capable of suppressing solder melted on an outer circumferential side of an abutting area between the solder inflow suppressing portion and the plate-like member from flowing into an inner circumferential side of the abutting area when the main body is soldered; and
      a soldering portion that is provided on an outer circumferential side of the solder inflow suppressing portion and is to be soldered to the electrically conductive portion provided on the plate-like member.

2. The contact according to claim 1, wherein the soldering portion is configured to include a region which forms a gap between the soldering portion and the plate-like member when the solder inflow suppressing portion comes into abutment with the plate-like member around the attachment hole.

3. The contact according to claim 1, wherein the soldering portion includes surfaces to be wetted up by molten solder when the main body is soldered, the surfaces being sloped surfaces which are sloped with respect to a front surface or a reverse surface of the plate-like member.

4. The contact according to claim 3, wherein the soldering portion is configured to have a conical cylindrical portion such that the closer to the plate-like member, the larger a diameter thereof becomes, when the main body is soldered, so that an inner periphery and an outer periphery of the conical cylindrical portion form the sloped surfaces.

5. The contact according to claim 1, wherein the main body includes a suction surface, which is suctionable by a suction nozzle of an automatic mounting machine, at an opposite position to a region where the tubular portion is provided, and a protrusion is provided on the suction surface such that the protrusion enters into an opening at a tip of the suction nozzle when the suction surface is suctioned by the suction nozzle.

6. The contact according to claim 1, wherein the main body includes a suction surface which is suctionable by a suction nozzle of an automatic mounting machine at an opposite position to a region where the tubular portion is provided, and the main body includes a through hole penetrating through between the suction surface and a housing space for the movable portion.

7. The contact bonding structure constituted by soldering the contact according to claim 1, wherein an electrically conductive portion is provided on a plate-like member, the plate-like member includes an attachment hole formed to penetrate through the plate-like member and the electrically conductive portion formed on an outer circumferential side of the attachment hole and spaced a distance apart from the attachment hole, and the solder inflow suppressing portion is configured to abut the plate-like member in an area defining the distance between the attachment hole and the electrically conductive portion when the tubular portion is inserted into the attachment hole.

* * * * *